United States Patent
Viertler

(10) Patent No.: US 11,670,474 B2
(45) Date of Patent: Jun. 6, 2023

(54) MONITORING AND TRIGGERING OF ELECTRICAL FUSES

(71) Applicant: Rolls-Royce Deutschland Ltd & Co KG, Blankenfelde-Mahlow (DE)

(72) Inventor: Rainer Viertler, Vaterstetten (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 0 days.

(21) Appl. No.: 17/288,251

(22) PCT Filed: Oct. 22, 2019

(86) PCT No.: PCT/EP2019/078762
§ 371 (c)(1),
(2) Date: Apr. 23, 2021

(87) PCT Pub. No.: WO2020/083936
PCT Pub. Date: Apr. 30, 2020

(65) Prior Publication Data
US 2021/0391136 A1     Dec. 16, 2021

(30) Foreign Application Priority Data
Oct. 24, 2018 (DE) ...................... 10 2018 218 238.8

(51) Int. Cl.
*H01H 85/05* (2006.01)
*G01R 27/08* (2006.01)
(Continued)

(52) U.S. Cl.
CPC ............ *H01H 85/05* (2013.01); *G01R 27/08* (2013.01); *H02M 7/537* (2013.01); *H03K 3/017* (2013.01)

(58) Field of Classification Search
None
See application file for complete search history.

(56) References Cited

U.S. PATENT DOCUMENTS

| 6,691,689 B2 | 2/2004 | Kiessling |
| 8,032,292 B2 * | 10/2011 | Kiessling ................ F02P 1/086 |
| | | 123/600 |

FOREIGN PATENT DOCUMENTS

| DE | 4012386 A1 | 10/1991 |
| DE | 19530586 A1 | 2/1997 |

(Continued)

OTHER PUBLICATIONS

International Search Report and the Written Opinion for International Patent Application PCT/EP2019/078762 dated Feb. 17, 2020, with English translation.

*Primary Examiner* — Cassandra F Cox
(74) *Attorney, Agent, or Firm* — Lempia Summerfield Katz LLC

(57) ABSTRACT

The invention relates to a circuit arrangement (12) for monitoring and triggering an igniter (5) of an active electrical fuse (6). The arrangement comprises: a control and evaluation unit (1), an alternating current generating unit (2) activated by the control and evaluation unit (1), an alternating current transmission unit arranged between the igniter (5) and the alternating current generating unit (2), the control and evaluation unit (1) being designed and programmed, in a first operational state, to determine the electrical resistance of the igniter (5) from a current detected on the primary side and a voltage detected on the primary side, the value of the resistance being a measure for tripping of the igniter (5), and, in a second operational state, to trigger the igniter (5) by means of the alternating current generating unit (2). The invention further relates to an associated method, to a computer program product which carries out the method and a computer-readable medium, and to a converter and to an aircraft having such a circuit arrangement.

15 Claims, 3 Drawing Sheets

(51) Int. Cl.
*H02M 7/537* (2006.01)
*H03K 3/017* (2006.01)

(56) References Cited

FOREIGN PATENT DOCUMENTS

| | | |
|---|---|---|
| DE | 19530588 A1 | 2/1997 |
| DE | 10030605 A1 | 1/2002 |
| DE | 102015203646 A1 | 9/2016 |
| DE | 102016124176 A1 | 1/2017 |
| DE | 102016218453 A1 | 3/2018 |
| DE | 102016222340 A1 | 5/2018 |
| WO | 9706979 A2 | 2/1997 |

* cited by examiner

MONITORING AND TRIGGERING OF ELECTRICAL FUSES

This application is the National Stage of International Application No. PCT/EP2019/078762, filed Oct. 22, 2019, which claims the benefit of German Patent Application No. DE 10 2018 218 238.8, filed Oct. 24, 2018. The entire contents of these documents are hereby incorporated herein by reference.

FIELD

The present embodiments relate to a circuit arrangement for monitoring and triggering an ignition pellet of an active electrical fuse. The present embodiments also relate to an associated method as well as a converter and an aircraft having such a circuit arrangement. A computer program product and a computer-readable storage medium for carrying out the method are also provided.

BACKGROUND

In electrical engineering, fuses have the task of protecting downstream electrical systems, actuators, devices, or lines from overload or short circuits.

Fuses may be divided into passively triggering or actively controlled fuses. Passively triggering fuses isolate due to the overcurrent or short circuit in the fuse itself. Either a metal strip between two connections melts due to excessive overload or a magnetic coil isolates both poles via a contact or plunger due to a magnetic force that has been reached.

Fuses are defined by voltage and current limits as well as by the disconnection speed, load integrals, and the disconnection behavior. The isolation speed plays a major role in fuses. Fusible links or magnetically triggering fuses are considered to be versatile components due to defined and proven structure.

While in the case of an alternating voltage the voltage to be isolated goes through the zero point again and again, in the case of a direct voltage, there is always a voltage difference at both connections during the fuse failure. This provides that if there is no zero crossing of the voltage, the arc inside the fuse may remain in the event of a pending isolation.

Although technical solutions reduce the arc duration, the technical solutions do not completely eliminate the arc in all cases. The longer and larger the arcs inside the fuses, the greater the exposure to high temperatures and high gas pressures. Therefore, reducing the triggering time may reduce the load on the fuses and the downstream components, devices, and lines.

Therefore, in addition to passively melting fuses, there are also actively triggering fuses. These isolate the two load-carrying connections (e.g., load side) of the fuse by an explosive charge on the triggering side. The explosive charge is ignited either automatically in the event of a defined overcurrent or by an active ignition action from the outside (e.g., by determining the overcurrent/short circuit to be controlled via additional electronics and the ignition action, such as ignition) also being carried out via additional electronics.

Actively triggering fuses are also referred to as quick-action releases or quick-action release devices. In the following text, only "fuse" is used as a term.

Feedback of the triggering to the superordinate control system is possible in the case of a passively isolating fuse (e.g., by way of external potential-free switches or integrated display elements in the fuse). In the case of an actively isolating fuse, due to a high gas pressure at the time of isolation and the arc that occurs inside the fuse, an external trigger display or a potential-free switch is only possible with considerable effort.

The following considerations are to be observed for fuses: How is the fuse triggered; how can feedback about a triggered or non-triggered fuse also be received on an electrically isolated side—; how is the functionality of the fuse triggering function to be provided before triggering; and what options are there for quality assessment?

In the case of a passively triggering fuse, the appropriate fuse is selected according to technical data (e.g., melting load integral). The measuring, triggering, and load-bearing functions are combined in a single safety component and are characterized by a high level of reliability.

The feedback about a triggered fuse and therefore about any missing functions of the above-mentioned ones may be effected via the following criteria: Voltage drop measurement at the triggering fuse; measurement of the interrupted current; resistance measurement of the fuse after decoupling from the user system; and possible change in behavior of the downstream consumer after disconnection.

In the case of actively triggering fuses, detection may take place on the load side. As with passive fuses, the above criteria may also be applied to actively isolating fuses.

In the event of detection on the triggering side, the following applies. On the triggering side, the state of the actively isolating explosive pellet may be used to draw a conclusion about a possible fuse failure. This is done, for example, using special ignition timing testers. The special ignition testers measure the resistance of the triggering initial detonator; for this purpose, however, the fuse is to be decoupled from the application system. The resistance is defined exactly in accordance with the data sheet; if the resistance differs from the data sheet, there is a possible fuse triggering or a fault in the actuation circuit.

In the laid-open specification WO 1997/006979 A2, an arrangement for checking the resistance of a load connected to a transformer is disclosed, where a measurement resistor is switched on to determine differences from the real resistance of an ignition pellet.

SUMMARY AND DESCRIPTION

The scope of the present invention is defined solely by the appended claims and is not affected to any degree by the statements within this summary.

The present embodiments may obviate one or more of the drawbacks or limitations in the related art. For example, in the case of actively triggering electrical fuses, a division into a triggering side and a load side is provided, and it may be determined whether both sides still functionally provide reliable isolation.

According to the present embodiments, a circuit arrangement, a converter, an aircraft, a method, a computer program product, and a computer-readable medium are provided.

The triggering side of an active fuse is assessed. A large number of analysis options may be provided with a circuit arrangement that includes a transformer, a decoupling capacitor, and clock actuation by actuating signals in different modes of operation.

The present embodiments offer the advantage that an explosive pellet of an active electrical fuse may be actuated by the combination of the individual components. In addition, the individual components in the actuation circuit may be checked, the quality of the entire electrical circuit may be assessed, and a conclusion may be drawn about the load circuit.

The conclusion about the load circuit may provide, for example, by a changed capacity of the load circuit with respect to ground or protective earth (PE) or bonding (e.g., hull of an aircraft in aviation) after triggering.

The present embodiments include a circuit arrangement for monitoring and triggering an ignition pellet of an active electrical fuse. The arrangement has a control and evaluation unit, an alternating current generation unit actuated by the control and evaluation unit, and an alternating current transmission unit arranged between the ignition pellet and the alternating current generation unit. The control and evaluation unit is configured and programmed, in a first operating state, to determine the electrical resistance of the ignition pellet from a current detected on the primary side and a voltage detected on the primary side. A value of the resistance (e.g., complex resistance, impedance) is a measure for triggering the ignition pellet, and, in a second operating state, to trigger the ignition pellet by the alternating current generation unit.

This allows the ignitability of the ignition pellet to be determined robustly and reliably, but also to be triggered safely and quickly.

In a further embodiment, the control and evaluation unit may be configured and programmed to change the pulse width of the alternating current generation unit. In the first operating state, given a pulse width of the alternating current generation unit below a predeterminable threshold value, the control and evaluation unit may be configured and programmed to determine the electrical resistance of the ignition pellet from the current detected on the primary side and the voltage detected on the primary side (e.g., no fire current or pulse). and, in the second operating state, set a pulse width of the alternating current generation unit above the predeterminable threshold value (e.g., all fire current or pulse).

In a further embodiment, the control and evaluation unit may determine the impedance of the actuation chain controlled by the control and evaluation unit.

In a further embodiment, a capacitor, which blocks the direct current component, may be arranged on the primary side in series with the alternating current transmission unit.

In a further embodiment, the alternating current generation unit may be configured as a transformer with coil windings that are isolated from one another, whereby the primary side is electrically isolated from the secondary side and provides freedom from potential on the secondary side.

In a further embodiment, the alternating current generation unit may actuate a push-pull output driver circuit via two separate signals and thus generate two mutually inverse alternating current signals.

The present embodiments also include a method for monitoring and triggering an ignition pellet of an active electrical fuse. An alternating current is fed on the primary side from an alternating current generation unit into an alternating current transmission unit, and, in a first operating state, the electrical resistance of the ignition pellet connected to the alternating current transmission unit on the secondary side is determined from a current detected on the primary side and a voltage detected on the primary side. The value of the resistance is a measure for triggering the ignition pellet, and, in a second operating state, the ignition pellet is triggered by the alternating current generation unit.

In one development, in the first operating state, an alternating current with a pulse width below a predeterminable threshold value is fed on the primary side from the alternating current generation unit into the alternating current transmission unit. The electrical resistance of the ignition pellet is determined from the current detected on the primary side and the voltage detected on the primary side, and, in the second operating state, the pulse width of the alternating current of the alternating current generation unit is increased above the threshold value.

In one development, the method may be carried out using a circuit arrangement according to the present embodiments.

The present embodiments also include a computer program product, including a computer program, where the computer program may be loaded into a storage device of a control and evaluation unit. The acts of a method according to the present embodiments are carried out using the computer program when the computer program is executed on the control and evaluation unit.

The present embodiments also include a computer-readable medium, on which a computer program is stored. The computer program may be loaded into a storage device of a control and evaluation unit, where the acts of a method according to the present embodiments are carried out using the computer program when the computer program is executed on the control and evaluation unit.

The present embodiments also include a converter (e.g., an inverter) having a circuit arrangement according to the present embodiments connected on the input side.

The present embodiments may also include an energy source (e.g., a battery, such as in an airplane) having a circuit arrangement according to the present embodiments connected on the output side.

The present embodiments also include an aircraft (e.g., an airplane) having a converter according to the present embodiments for an electric or hybrid-electric aircraft propulsion system.

In a further embodiment, the aircraft may have an electric motor that is supplied with electrical energy by the inverter and a propeller that may be set in rotation by the electric motor.

Further special features and advantages of the present embodiments become clear from the following explanations of exemplary embodiments with reference to schematic drawings.

DETAILED DESCRIPTION

Figure 1:
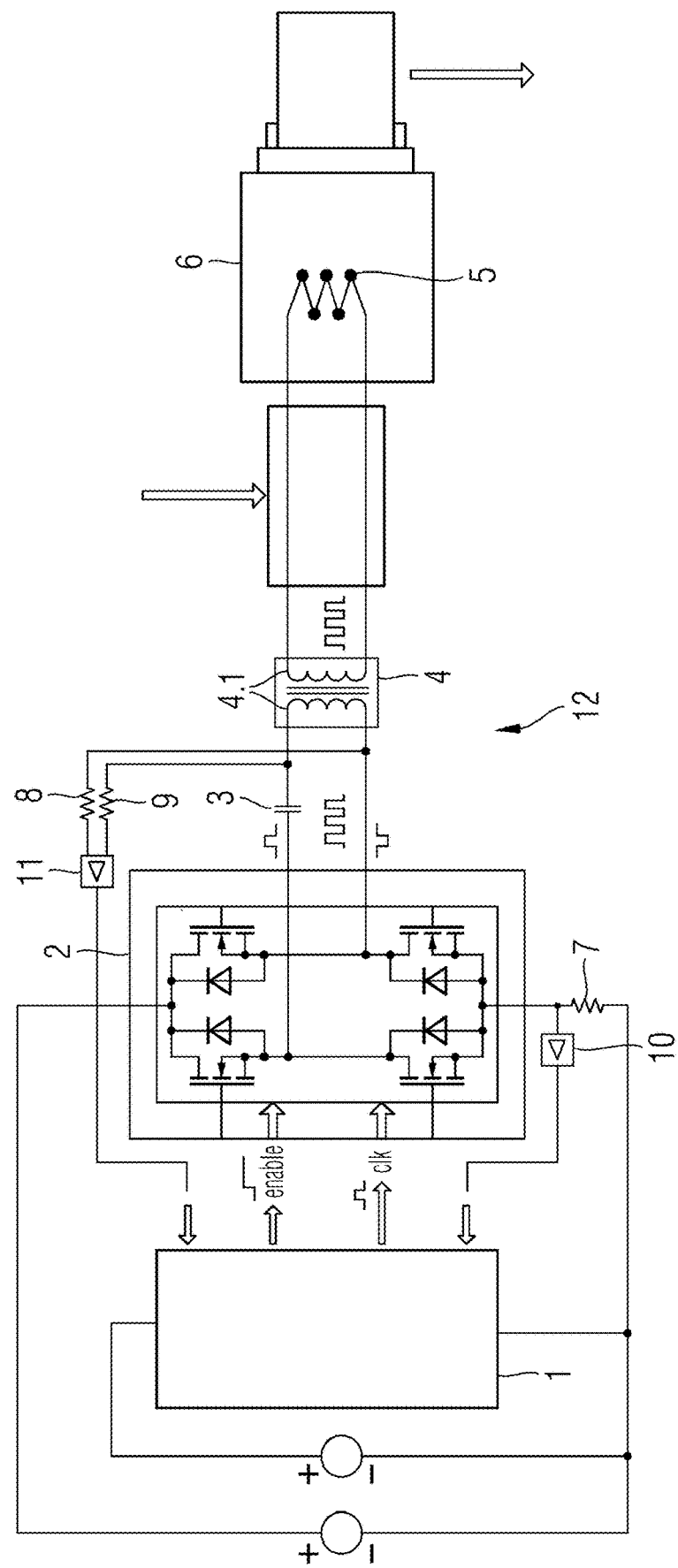
FIG. 1 shows a circuit diagram of one embodiment of a circuit arrangement.

FIG. 1 shows a circuit diagram of one embodiment of a circuit arrangement 12. A control and evaluation unit 1 embodied as a microcontroller, for example, actuates an alternating current generation unit 2 configured as a push-pull output driver circuit, for example, via two separate signals. An "enable" signal is used to switch the alternating current generation unit 2 to "active". A clock input "clk" at an input of the alternating current generation unit 2 actuates output stages in push-pull mode and thus determines a frequency and a pulse width of an alternating voltage. Two outputs of the alternating current generation unit 2 thus operate inversely, and a complementary alternating current signal is generated in this way.

The alternating current generation unit 2 actuates an alternating current transmission unit 4 via a capacitor 3 on a primary side. On a secondary side, the alternating current transmission unit 4 actuates an ignition pellet 5 (e.g., an explosive pellet) inside an actively isolating fuse 6. The alternating current transmission unit 4 has a guaranteed freedom from potential due to isolated coil windings 4.1, and the primary side is thus electrically isolated from the secondary side.

The ignition pellet 5 has a resistor with a defined resistance value. The resistance value may be transformed to the primary side by suitable control pulse signals (e.g., voltage/current). Using a first measurement resistor 7, an actual value of the resistance value of the ignition pellet 5 may be detected via a first amplifier 10 at the control and evaluation unit 1. In this case, the pulse width remains below a predeterminable threshold value that is selected so that the ignition pellet 5 does not yet trigger (e.g., first operating state).

If the control and evaluation unit 1 is to actively trigger an ignition of the fuse 6 (e.g., second operating state), the control and evaluation unit 1 controls the pulse width above the predeterminable threshold value so that the ignition pellet 5 is triggered via the alternating current transmission unit 4, the alternating current generation unit 2, and via the capacitor 3, since the current through the ignition pellet 5 is above the ignition current. Using the first measurement resistor 7, a change in the resistance value of the ignition pellet 5 may be detected via the first amplifier 10 at the control and evaluation unit 1.

This change may be detected on the primary side, as may changes or malfunctions before triggering has occurred. The current, which is measured in the ground branch of the alternating current generation unit 2 and is sent to the control and evaluation unit 1 via the first amplifier 10, is, together with the clock signal, an evaluation criterion for the real resistance of the ignition pellet 5, transformed via the alternating current transmission unit 4.

Voltage feedback via a second resister 8 and a third resistors 9 and a second amplifier 11 reports a primary voltage back to the alternating current transmission unit 4.

The fuse 6 may be operated in a voltage range above a safe protective low voltage level. This is why guaranteed potential isolation is to be provided.

When the alternating current generation unit 2 is actuated and voltage and current are measured simultaneously, it is possible to determine exactly when the ignition pellet 5 was triggered.

Faults in the entire interconnection may be detected. (e.g., capacitance measurement, inductance measurement, and resistance measurement in the ignition pellet circuit).

By varying the frequency at the "clk" input, the capacitor 3 and the alternating current transmission unit 4 may be tested individually (e.g., checking of the individual components selectively).

A comparison of curve shapes with stored values in a data table in the control and evaluation unit 1 is possible.

By short-circuiting both outputs in the alternating current generation unit 2, the subsequent elements may be short-circuited. This increases the EMC immunity.

Instead of a full-bridge, a half-bridge may also be used.

The system safety may be increased if two separate ignition pellets 5 are used in the fuse 6 and two separate actuation circuits are used. For example, if the system safety is triggered, the separate "other" ignition circuit can thus be checked, since one explosive pellet automatically ignites the other. This doubling of the ignition pellets 5 is disclosed by way of example in the laid-open specification DE 10 2015 203 646 A1.

Figure 2:
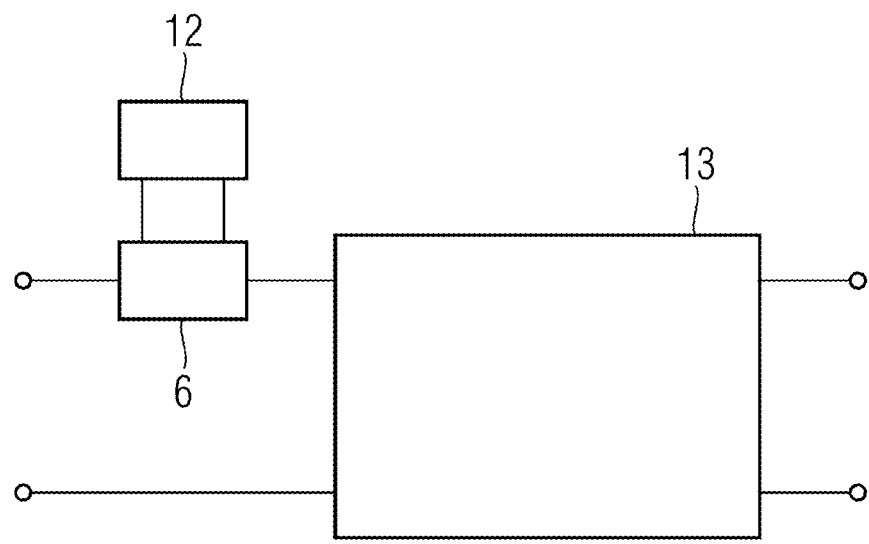
FIG. 2 shows a block diagram of one embodiment of an arrangement having a converter.

FIG. 2 shows a block diagram of one embodiment of an arrangement having an inverter 13 as the load and a circuit arrangement 12 according to FIG. 1. The inverter 13 is an embodiment of a converter. The fuse 6 is in contact with one or both inputs of the inverter 13. The circuit arrangement 12 and the fuse 6 may also be integrated in the inverter 13.

Figure 3:
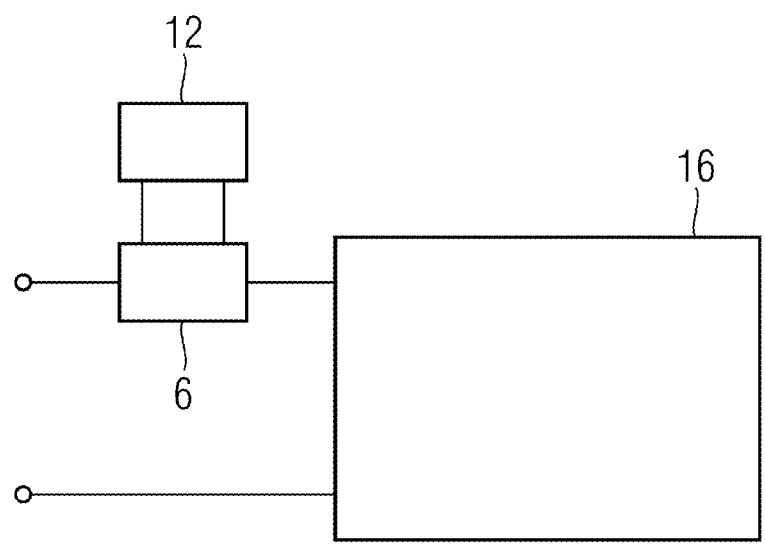
FIG. 3 shows a block diagram of one embodiment of an arrangement having a battery.

FIG. 3 shows a block diagram of one embodiment of an arrangement having a chargeable battery 16 as the load and a circuit arrangement 12 according to FIG. 1. The fuse 6 is in contact with one or both battery poles. The circuit may thus be interrupted when charging or discharging.

Figure 4:
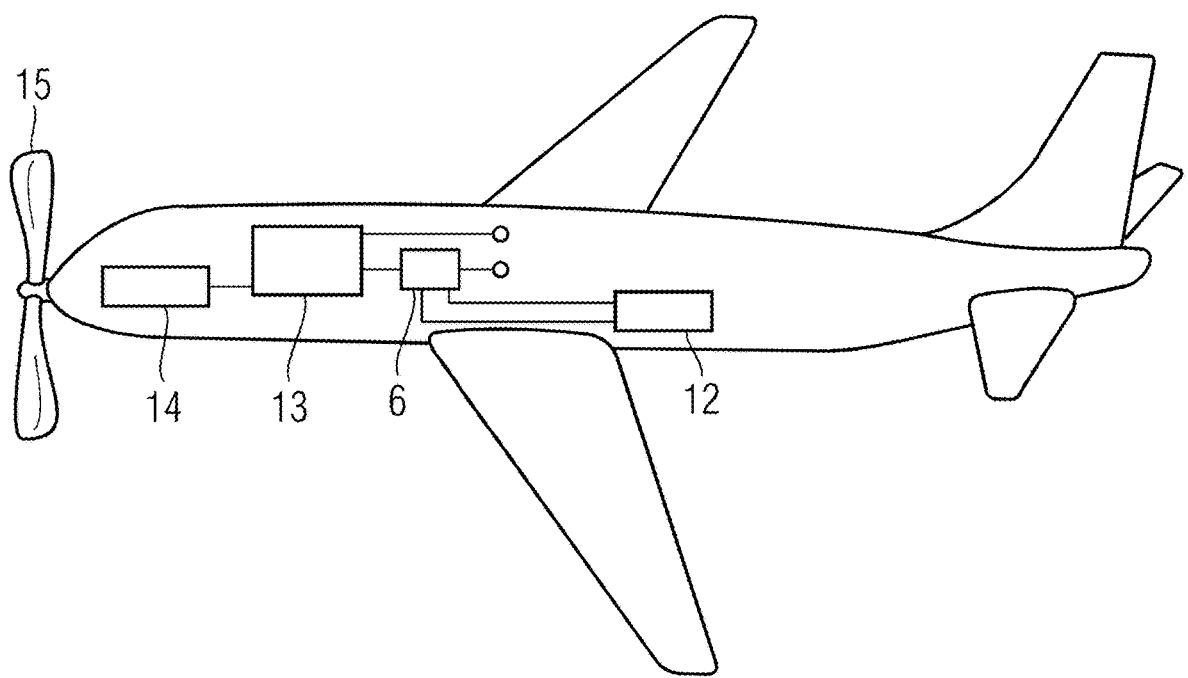
FIG. 4 shows an illustration of one embodiment of an airplane having a circuit arrangement.

FIG. 4 shows one embodiment of an electric or hybrid-electric aircraft (e.g., e an airplane 13) having an inverter 13 and a circuit arrangement 12 with fuse 6 according to FIG. 2. The inverter 13 feeds an electric motor 14 with electrical energy. The electric motor 14 drives a propeller 15.

Although the invention has been described and illustrated more specifically in detail by the exemplary embodiments, the invention is not restricted by the disclosed examples, and other variations may be derived therefrom by a person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A circuit arrangement for monitoring and triggering an ignition pellet of an active electrical fuse, the circuit arrangement comprising:
   a control and evaluation unit;
   an alternating current generation unit actuated by the control and evaluation unit; and
   an alternating current transmission unit arranged between the ignition pellet and the alternating current generation unit,
   wherein the control and evaluation unit is configured and programmed to:
      in a first operating state, determine an electrical resistance of the ignition pellet from a current detected on a primary side and a voltage detected on the primary side, the primary side being relative to the alternating current transmission unit, wherein a value of the electrical resistance is a measure for triggering the ignition pellet; and
      in a second operating state, trigger the ignition pellet by the alternating current generation unit.

2. The circuit arrangement of claim 1, wherein the control and evaluation unit is further configured and programmed to:
- change a pulse width of the alternating current generation unit;
- in the first operating state, given a pulse width of the alternating current generation unit below a predeterminable threshold value, determine the electrical resistance of the ignition pellet from the current detected on the primary side and the voltage detected on the primary side; and
- in the second operating state, set a pulse width of the alternating current generation unit above the predeterminable threshold value.

3. The circuit arrangement of claim 1, wherein the control and evaluation unit is further configured and programmed to determine an impedance of an actuation chain controlled by the control and evaluation unit.

4. The circuit arrangement of claim 1, further comprising:
- a capacitor arranged on the primary side in series with the alternating current transmission unit and configured to block direct current.

5. The circuit arrangement of claim 1, wherein the alternating current transmission unit is configured as a transformer with coil windings that are isolated from one another, and
wherein the primary side is electrically isolated from a secondary side.

6. The circuit arrangement of claim 1, wherein the alternating current generation unit is configured to:
- actuate a push-pull output driver circuit via two separate signals; and
- generate two mutually inverse alternating current signals.

7. A method for monitoring and triggering an ignition pellet of an active electrical fuse, the method comprising:
- feeding an alternating current on a primary side from an alternating current generation unit into an alternating current transmission unit;
- in a first operating state, determining an electrical resistance of the ignition pellet connected on a secondary side to the alternating current transmission unit from a current detected on the primary side and a voltage detected on the primary side, wherein a value of the electrical resistance is a measure for triggering the ignition pellet; and
- in a second operating state, triggering the ignition pellet by the alternating current generation unit.

8. The method of claim 7, wherein in the first operating state, an alternating current with a pulse width below a predeterminable threshold value is fed on the primary side from the alternating current generation unit into the alternating current transmission unit,
wherein the electrical resistance of the ignition pellet is determined from the current detected on the primary side and the voltage detected on the primary side, and
wherein in the second operating state, the pulse width of the alternating current of the alternating current generation unit is increased above the threshold value.

9. The method of claim 7, wherein the alternating current transmission unit is arranged between the ignition pellet and the alternating current generation unit.

10. A non-transitory computer-readable storage medium that stores instructions executable by a control and evaluation unit to monitor and trigger an ignition pellet of an active electrical fuse, the instructions comprising:
- feeding an alternating current on a primary side from an alternating current generation unit into an alternating current transmission unit, the primary side being relative to the alternating current transmission unit;
- in a first operating state, determining an electrical resistance of the ignition pellet connected on a secondary side to the alternating current transmission unit from a current detected on the primary side and a voltage detected on the primary side, wherein a value of the electrical resistance is a measure for triggering the ignition pellet; and
- in a second operating state, triggering the ignition pellet by the alternating current generation unit.

11. A converter comprising:
a circuit arrangement for monitoring and triggering an ignition pellet of an active electrical fuse, the circuit arrangement comprising:
- a control and evaluation unit;
- an alternating current generation unit actuated by the control and evaluation unit; and
- an alternating current transmission unit arranged between the ignition pellet and the alternating current generation unit, wherein the control and evaluation unit is configured and programmed to, in a first operating state, determine an electrical resistance of the ignition pellet from a current detected on a primary side and a voltage detected on the primary side, the primary side being relative to the alternating current transmission unit, wherein a value of the electrical resistance is a measure for triggering the ignition pellet, and in a second operating state, trigger the ignition pellet by the alternating current generation unit,
wherein the circuit arrangement is connected on an input side.

12. The converter of claim 11, wherein the converter is an inverter.

13. An aircraft comprising:
a converter for an electric or hybrid-electric aircraft propulsion system, the converter comprising:
a circuit arrangement for monitoring and triggering an ignition pellet of an active electrical fuse, the circuit arrangement comprising:
- a control and evaluation unit;
- an alternating current generation unit actuated by the control and evaluation unit; and
- an alternating current transmission unit arranged between the ignition pellet and the alternating current generation unit, wherein the control and evaluation unit is configured and programmed to, in a first operating state, determine an electrical resistance of the ignition pellet from a current detected on a primary side and a voltage detected on the primary side, the primary side being relative to the alternating current transmission unit, wherein a value of the electrical resistance is a measure for triggering the ignition pellet, and in a second operating state, trigger the ignition pellet by the alternating current generation unit,
wherein the circuit arrangement is connected on an input side.

14. The aircraft of claim 13, wherein the aircraft is an airplane.

15. The aircraft of claim 14, wherein the converter is an inverter, and
wherein the aircraft further comprises:
- an electric motor that is supplied with electrical energy by the inverter; and a propeller that is settable in rotation by the electric motor.

\* \* \* \* \*